United States Patent
Kim

(10) Patent No.: US 9,118,030 B2
(45) Date of Patent: Aug. 25, 2015

(54) ORGANIC LIGHT-EMITTING DEVICE AND METHOD OF MANUFACTURING THE SAME

(71) Applicant: Samsung Display Co., Ltd., Yongin, Gyeonggi-do (KR)

(72) Inventor: Young-Il Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/279,257

(22) Filed: May 15, 2014

(65) Prior Publication Data

US 2015/0115233 A1    Apr. 30, 2015

(30) Foreign Application Priority Data

Oct. 29, 2013    (KR) .......................... 10-2013-0129559

(51) Int. Cl.
| | |
|---|---|
| *H01L 51/52* | (2006.01) |
| *H01L 51/56* | (2006.01) |
| *H01L 51/50* | (2006.01) |
| *H01L 27/32* | (2006.01) |
| *H01L 51/00* | (2006.01) |

(52) U.S. Cl.
CPC ........ *H01L 51/5012* (2013.01); *H01L 27/3244* (2013.01); *H01L 51/0004* (2013.01); *H01L 51/5056* (2013.01); *H01L 51/56* (2013.01); *H01L 51/0037* (2013.01); *H01L 51/0059* (2013.01); *H01L 51/0078* (2013.01)

(58) Field of Classification Search
None
See application file for complete search history.

(56) References Cited

U.S. PATENT DOCUMENTS

| 8,796,920 | B2 * | 8/2014 | Han ............................ 313/512 |
| 2001/0045565 | A1 * | 11/2001 | Yamazaki ...................... 257/89 |
| 2004/0189194 | A1 | 9/2004 | Kihara et al. |
| 2005/0287392 | A1 | 12/2005 | Toyoda |
| 2008/0309232 | A1 * | 12/2008 | Yamamoto .................... 313/505 |
| 2010/0060153 | A1 * | 3/2010 | Uchida et al. ................ 313/504 |
| 2010/0181559 | A1 | 7/2010 | Nakatani et al. |
| 2015/0014642 | A1 * | 1/2015 | Kwon et al. ................... 257/40 |

FOREIGN PATENT DOCUMENTS

| KR | 10-2004-0053229 A | 6/2004 |
| KR | 10-2006-0046206 A | 5/2006 |
| KR | 10-2010-0027150 A | 3/2010 |

* cited by examiner

*Primary Examiner* — Joseph Schoenholtz

(74) *Attorney, Agent, or Firm* — Christie, Parker & Hale, LLP

(57) ABSTRACT

Disclosed is an organic light-emitting device. The organic light-emitting device includes a first pixel electrode that is disposed on a substrate, a first conductive film that is formed on the substrate to cover the first pixel electrode, a second conductive pattern and an insulating layer that are sequentially formed on the first conductive film and include an opening which exposes a portion of a top of the first conductive film, a hole injection layer that is formed on the opening and the insulating layer to cover the exposed first conductive film, a hole transport layer that is formed in a partial region of the hole injection layer and the opening, and an emissive layer that is formed on the hole transport layer.

20 Claims, 6 Drawing Sheets

ORGANIC LIGHT-EMITTING DEVICE AND METHOD OF MANUFACTURING THE SAME

CROSS-REFERENCE TO RELATED APPLICATION

This application claims priority to and the benefit of Korean Patent Application No. 10-2013-0129559, filed on Oct. 29, 2013, in the Korean Intellectual Property Office, the disclosure of which is incorporated herein in its entirety by reference.

BACKGROUND

1. Field

One or more embodiments of the present invention relate to an organic light-emitting device and a method of manufacturing the same.

2. Description of the Related Art

Organic light-emitting display apparatuses are driven with a low voltage, are light and thin, and have a broad viewing angle, a good contrast, and a fast response time, thereby attracting much attention as the next-generation display apparatuses.

Such organic light-emitting display apparatuses have a broad emission wavelength, and for this reason, an emission efficiency and a color purity are reduced. Also, since light emitted from the organic emission layer has no directionality, most of the photons emitted in an arbitrary direction cannot reach an actual observer due to total internal reflection of the organic light-emitting device, thereby causing a reduction in a light extraction efficiency of the organic light-emitting device. To solve such a problem, a method that adjusts a thickness of the organic emission layer to form a resonance structure and thus increases the light extraction efficiency is being used. However, it is difficult to apply the resonance structure to an organic light-emitting display apparatus of which the organic emission layer is formed by a printing method. Also, in the organic light-emitting display apparatus using the printing method, as the coated liquid light-emitting material becomes dry, the thickness of the organic emission layer is not uniformly formed at an edge region of an emission unit, thereby causing non-uniform emission of light.

SUMMARY

An aspect according to one or more embodiments of the present invention is directed toward an organic light-emitting device with improved uniformity of an organic emission layer and a method of manufacturing the same. An aspect according to one or more embodiments of the present invention is directed toward an organic light-emitting device and a method of manufacturing the same in which, in manufacturing the organic light-emitting device using (utilizing) a printing method, a thickness of a pixel defining layer is thinly formed, and thus, light is prevented from being emitted from an edge region of an emission unit, thereby enhancing a quality of extracted light.

Additional aspects will be set forth in part in the description which follows and, in part, will be apparent from the description, or may be learned by practice of the presented embodiments.

According to one or more embodiments of the present invention, an organic light-emitting device includes: a first pixel electrode on a substrate; a first conductive film on the substrate and configured to cover the first pixel electrode; a second conductive pattern and an insulating layer sequentially formed on the first conductive film, the second conductive pattern and the insulating layer having an opening to expose a portion of a top of the first conductive film; a hole injection layer on the opening and the insulating layer to cover the exposed portion of the first conductive film; a hole transport layer formed in the opening and a partial region of the hole injection layer; and an emissive layer on the hole transport layer.

A conductivity of the first conductive film may be about $10^{-5}$ to about $10^{-3}$ S/cm, and a work function of the first conductive film may be about 5.0 to about 5.7 eV.

The hole injection layer may be formed to surround an exposed side surface of the insulating layer and an exposed side surface of the second conductive pattern.

A thickness of the second conductive pattern may be about 1 to about 10 nm, and a thickness of the insulating layer may be about 10 to about 90 nm.

The second conductive pattern and the insulating layer, each having the opening, form a pixel defining layer.

The hole transport layer may include a bank region in which the emissive layer is formed.

The insulating layer may be formed by a gravure coating method, a slit coating method, a bar coating method, a spray coating method, a vacuum filtration method, a spin coating method, an electrophoretic deposition method, a casting method, an inkjet printing method, and/or an offset printing method.

The emissive layer may be formed by an inkjet printing method, a nozzle printing method, a gravure printing method, a screen printing method, a spray printing method, and/or an electrostatic spray printing method.

The organic light-emitting device may further include: an electron transport layer on the emissive layer; and an electron injection layer on the electron transport layer.

The hole injection layer may be formed of a phthalocyanine compound, DNTPD (N,N'-diphenyl-N,N'-bis-[4-(phenyl-m-tolyl-amino)-phenyl]-biphenyl-4,4'-diamine), m-MTDATA(4,4',4"-tris(3-methylphenylphenylamino) triphenylamine), TDATA (4,4'4"-Tris(N,N-diphenylamino) triphenylamine), 2T-NATA (4,4',4"-tris{N,-(2-naphthyl)-N-phenylamino}-triphenylamine), PEDOT/PSS (Poly(3,4-ethylenedioxythiophene)/Poly(4-styrenesulfonate)), Pani/DBSA (Polyaniline/Dodecylbenzenesulfonic acid), Pani/CSA (Polyaniline/Camphor sulfonicacid), and/or PANI/PSS (Polyaniline)/Poly(4-styrenesulfonate).

The organic light-emitting device may further include: a second pixel electrode on the emissive layer; and an encapsulating unit including one or more inorganic layers and one or more organic layers alternately formed to cover the second pixel electrode.

According to one or more embodiments of the present invention, a method of manufacturing an organic light-emitting device includes: forming a first pixel electrode on a substrate; forming a first conductive film to cover the first pixel electrode; sequentially forming a second conductive pattern and an insulating layer to have an opening to expose a portion of a top of the first conductive film; forming a hole injection layer on the opening and the insulating layer; forming a hole transport layer in the opening and a partial region of the hole injection layer; and forming an emissive layer on the hole transport layer.

The forming of the second conductive pattern may include: forming a second conductive material on the first conductive film; and forming the second conductive pattern to expose the portion of the top of the first conductive film by utilizing a mask applied to the second conductive material.

The sequentially forming of the second conductive pattern and the insulating layer may include forming the insulating layer on the second conductive pattern by utilizing a gravure coating method, a slit coating method, a bar coating method, a spray coating method, a vacuum filtration method, a spin coating method, an electrophoretic deposition method, a casting method, an inkjet printing method, and/or an offset printing method.

A thickness of the second conductive pattern may be about 1 to about 10 nm, and a thickness of the insulating layer may be about 10 to about 90 nm.

The forming of the hole injection layer may include forming the hole injection layer to surround an exposed side surface of the insulating layer and an exposed side surface of the second conductive pattern.

The forming of the hole transport layer may include: forming a hole transport material on the hole injection layer; and forming the hole transport layer including a bank region in which the emissive layer is formed in the opening, by utilizing a mask applied to the hole transport material.

The forming of the emissive layer may include: forming a light-emitting material in the bank region by utilizing an inkjet printing method, a nozzle printing method, a gravure printing method, a screen printing method, a spray printing method, and/or an electrostatic spray printing method; and drying the light-emitting material to form the emissive layer.

The forming of the emissive layer may include: forming an electron transport layer on the emissive layer after the forming of the emissive layer; and forming an electron injection layer on the electron transport layer.

The method may further include: forming a second pixel electrode on the emissive layer after the forming of the emissive layer; and forming an encapsulating unit to cover the second pixel electrode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
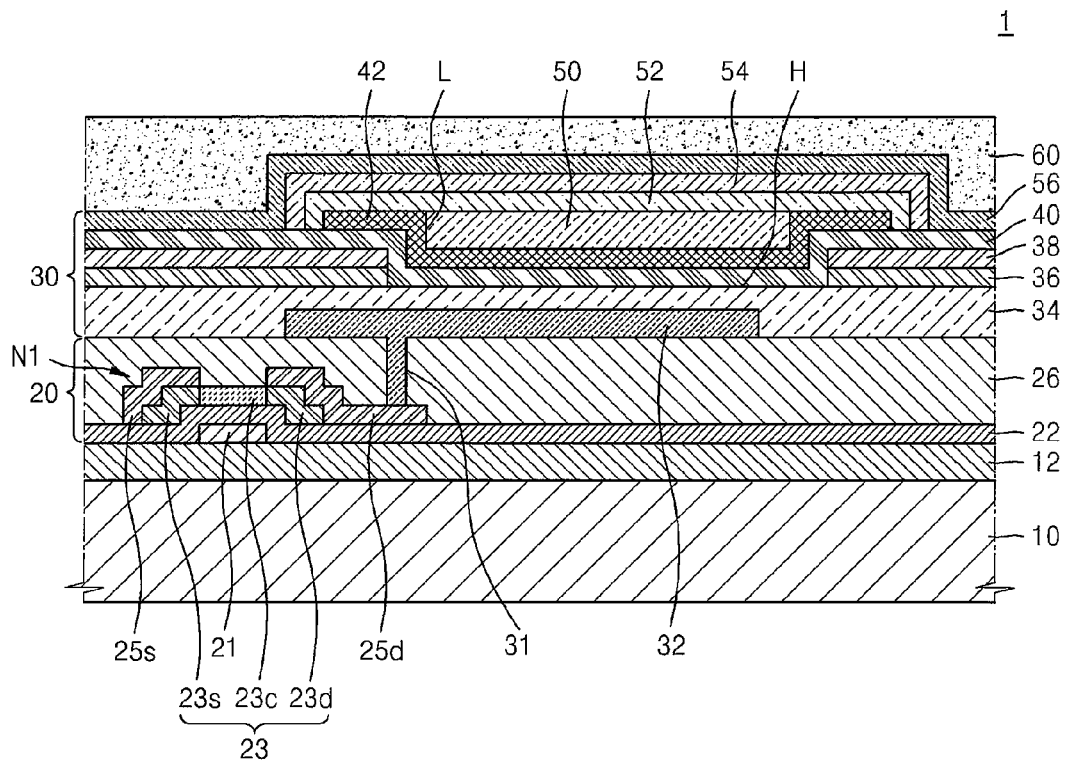
FIG. 1 is a schematic cross-sectional view illustrating an organic light-emitting device according to an embodiment of the present invention.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

Since the present embodiments may have diverse modified embodiments, example embodiments are illustrated in the drawings and are described in the detailed description. However, this does not limit the present embodiments within specific embodiments and it should be understood that the inventive concept covers all the modifications, equivalents, and replacements within the idea and technical scope of the present embodiments. Moreover, detailed descriptions related to known functions or configurations will not be provided in order not to unnecessarily obscure subject matters of the present embodiments.

Terms such as a "first" and a "second" may be used to describe various elements, but the elements should not be limited by the terms. The terms may be used only for distinguishing one element from another element.

The terms used in this application to describe certain embodiments are not intended to limit the present embodiments. In the following description, the technical terms are used only to explain a specific example embodiment while not limiting the present embodiments. The terms of a singular form may include plural forms unless referred to the contrary. Terms such as "include," "comprise," "including," or "comprising," refer to the inclusion of a property, a region, a fixed number, a step, a process, an element and/or a component but does not exclude other properties, regions, fixed numbers, steps, processes, elements and/or components.

Hereinafter, embodiments of the present invention will be described in more detail with reference to the accompanying drawings.

FIG. 1 is a schematic cross-sectional view illustrating an organic light-emitting device 1 according to an embodiment of the present invention.

Referring to FIG. 1, the organic light-emitting device 1 according to an embodiment of the present invention includes a substrate 10, a driving thin film transistor (TFT) unit 20, an emission unit 30, and an encapsulation unit 60 covering the emission unit 30.

The substrate 10 may be a transparent glass substrate having $SiO_2$ as a main component, or may use a substrate of various suitable materials such as a plastic substrate, a metal substrate, or the like. Also, the substrate 10 may be formed of a suitable plastic material having excellent heat resistance and durability, such as polyethyleneterephthalate, polycarbonate, polyethylenenaphthalate, polyarylate, polyetherimide, polyether sulfone, or polyimide, which has a characteristic enabling a curved surface to be realized. However, the present embodiment is not limited thereto, and various materials having a suitable flexibility may be used.

In FIG. 1, a top-emission organic light-emitting device is illustrated as an example of the organic light-emitting device 1, but the present embodiment is not limited thereto. The organic light-emitting device 1 may be a bottom-emission organic light-emitting device or other suitable kinds of organic light-emitting devices different from the organic light-emitting device 1 of FIG. 1.

Moreover, a buffer layer 12 may be formed on a top of the substrate 10. The buffer layer 12 prevents impurity ions from being spread, prevents penetration of moisture or external air, and planarizes a surface.

The driving TFT unit 20, which is a driving circuit and includes a driving TFT N1, is formed on the buffer layer 12. In the present embodiment, as an example of a TFT, a case in which the organic light-emitting device 1 includes a bottom-gate TFT is illustrated. However, the organic light-emitting device 1 may include a TFT having another kind of TFT, such as a top gate TFT.

The driving TFT N1 may include a gate electrode 21, an active layer 23, a source electrode 25s, and a drain electrode 25d.

A gate insulating layer 22 for insulating the gate electrode 21 from the active layer 23 is formed between the gate electrode 21 and the active layer 23.

The gate electrode 21 may be formed of various suitable conductive materials. For example, the gate electrode 21 may be formed of a material such as magnesium (Mg), aluminum (Al), nickel (Ni), chromium (Cr), molybdenum (Mo), tungsten (W), molybdenum tungsten (MoW), gold (Au), or the like. Even in this case, the gate electrode 21 may be formed of a single layer or a multilayer, namely, the gate electrode 21 may be variously modified.

The active layer 23 includes a channel region 23c, a source region 23s, and a drain region 23d. The channel region 23c is disposed between the source region 23s and the drain region 23d, and the source region 23s and the drain region 23d are respectively disposed at edges of the active layer 23 and are doped with high-concentration impurities.

The active layer 23 may be formed of poly silicon, in which case a certain region may be doped with impurities. Alternatively, the active layer 23 may be formed of amorphous silicon instead of poly silicon, or may be formed of various suitable organic semiconductor materials such as pentacene.

In a process where the active layer 23 is formed of poly silicon, the active layer 23 is formed by a crystallization method in which amorphous silicon is first provided, and then is changed to poly silicon by crystallizing the amorphous silicon. Examples of the crystallization method (process) may include a rapid thermal annealing (RTA) process, a solid phase crystallization (SPC) process, an excimer laser annealing (ELA) process, a metal induced crystallization (MIC) process, a metal induced lateral crystallization (MILC) process, and a sequential lateral solidification (SLS) process. However, in the present embodiment, when a plastic substrate is used, a method that does not require a high-temperature heating process may be selected and used.

The gate insulating layer 22 may be formed of an insulating material such as silicon oxide, silicon nitride, or the like. In addition, the gate insulating layer 22 may be formed of an insulating organic material.

The source electrode 25s and the drain electrode 25d, which are electrically connected to each other, are respectively formed on the source region 23s and the drain region 23d of the active layer 23. Also, a planarization layer 26 (a protective layer and/or a passivation layer) is formed on the source electrode 25s and the drain electrode 25d, and protects and planarizes the driving TFT N1 thereunder.

The planarization layer 26 may be formed in various suitable structures, and for example, the planarization layer 26 may be formed of an organic material, such as benzocyclobutene (BCB) or acrylics, or an inorganic material such as SiNx. Also, the planarization layer 26 may be formed of a single layer, a double-layer, or a multilayer, namely, the planarization layer 26 may be variously modified.

A first pixel electrode 32 that is one electrode of the organic light-emitting device 1 is formed on the planarization layer 26, and is electrically connected to the drain electrode 25d through a contact hole 31.

A second pixel electrode 56, which is disposed opposite to the first pixel electrode 32, is formed on the first pixel electrode 32.

In one embodiment, the first pixel electrode 32 acts as an anode electrode, and the second pixel electrode 56 acts as a cathode electrode. Alternatively, the first and second electrodes 32 and 56 may be switched in polarity.

The first pixel electrode 32 may be formed as a transparent electrode or a reflective electrode. When the first pixel electrode 32 is formed as the transparent electrode, the first pixel electrode 32 may be formed of indium tin oxide (ITO), indium zinc oxide (IZO), zinc oxide (ZnO), or indium oxide ($In_2O_3$). When the first pixel electrode 32 is formed as the reflective electrode, the first pixel electrode 32 may include a reflective layer, which is formed of silver (Ag), magnesium (Mg), aluminum (Al), platinum (Pt), palladium (Pd), gold (Au), nickel (Ni), neodymium (Nd), iridium (Ir), chromium (Cr), or a compound (or alloy) thereof, and a transparent layer formed of ITO, IZO, ZnO, or $In_2O_3$.

The second pixel electrode 56 may be formed as a transparent electrode or a reflective electrode. When the second pixel electrode 56 is formed as the transparent electrode, the second pixel electrode 56 may include an intermediate layer, which is formed by depositing Li, Ca, LiF/Ca, LiF/Al, Al, Mg, or a compound thereof so as to form the intermediate layer, and an assistant electrode or a bus electrode line (which is formed of a transparent conductive material such as ITO, IZO, ZnO, or $In_2O_3$) is formed with the intermediate layer. When the second pixel electrode 56 is formed as the reflective electrode, the second pixel electrode 56 may be formed of Li, Ca, LiF/Ca, LiF/Al, Al, Mg, or a compound (or alloy) thereof.

The first pixel electrode 32, which is patterned for each sub-pixel, is electrically connected to a TFT of each sub-pixel. Here, the second pixel electrode 56 may be formed as a common electrode that is connected to common electrodes of respective sub-pixels.

A first conductive film 34 is formed on the planarization layer 26 to cover the first pixel electrode 32.

The first conductive film 34 may be formed of a suitable conductive material. For example, the conductive material may be a phthalocyanine compound (such as copper phthalocyanine), DNTPD (N,N'-diphenyl-N,N'-bis-[4-(phenyl-m-tolyl-amino)-phenyl]-biphenyl-4,4'-diamine), m-MTDATA (4,4',4''-tris(3-methylphenylphenylamino)triphenylamine), TDATA (4,4'4''-Tris(N,N-diphenylamino)triphenylamine), 2T-NATA (4,4',4''-tris{N,-(2-naphthyl)-N-phenylamino}-triphenylamine), PEDOT/PSS (Poly(3,4-ethylenedioxythiophene)/Poly(4-styrenesulfonate)), Pani/DBSA (Polyaniline/Dodecylbenzenesulfonic acid), Pani/CSA (Polyaniline/Camphor sulfonicacid), and/or PANI/PSS (Polyaniline)/Poly(4-styrenesulfonate). However, the technical spirit of the present embodiment is not limited thereto.

The first conductive film 34 may be formed by a vacuum evaporation method, a spin coating method, an inkjet printing method, a screen printing method, a spray printing method, and/or a heat transfer method. However, the technical spirit of the present embodiment is not limited thereto.

A conductivity of the first conductive film 34 may be, for example, about $10^{-5}$ to about $10^{-3}$ S/cm. A work function of the first conductive film 34 may be, for example, about 5.0 to about 5.7 eV. The first conductive film 34 electrically connects the first pixel electrode 32 to a hole injection layer (HIL) 40 formed on the first pixel electrode 32. Although not shown, the first conductive film 34 may be patterned for preventing short circuit between the first conductive film 34 and a first pixel electrode of each of the pixels other than the first pixel electrode 32 of the corresponding pixel.

A thickness of the first conductive film 34 may be, for example, about 10 nm or less.

A second conductive pattern 36 and an insulating layer 38 are formed on the first conductive film 34 to have an opening H that exposes a portion of a top of the first conductive film 34.

The second conductive pattern 36 may be formed of a conductive material, and may have a thickness of about 1 to about 10 nm. Also, the second conductive pattern 36 may be formed by the vacuum evaporation method, the spin coating method, the inkjet printing method, the screen printing method, the spray printing method, and/or the heat transfer method. However, the technical spirit of the present embodiment is not limited thereto.

The insulating layer 38 may be formed of an insulating material such as silicon oxide or silicon nitride, or may be formed of an insulating organic material. A thickness of the insulating material 38' (see FIG. 5) may be about 10 to about 90 nm, and the insulating material 38' may be formed by a gravure coating method, a slit coating method, a bar coating method, a spray coating method, a vacuum filtration method, a spin coating method, an electrophoretic deposition method, a casting method, an inkjet printing method, and/or an offset printing method. However, the technical spirit of the present embodiment is not limited thereto.

Since the second conductive pattern 36 and the insulating layer 38 are formed in order for a partial region of the top of the first conductive film 34 to be exposed, the second conductive pattern 36 and the insulating layer 38 form a step height with the exposed first conductive film 34. That is, the layer of the second conductive pattern 36 and the insulating layer 38 include the opening H that exposes the top of the first conductive film 34.

The HIL 40 is formed to cover the opening H and the insulating layer 38.

The HIL 40 may be formed of a phthalocyanine compound (such as copper phthalocyanine), DNTPD (N,N'-diphenyl-N,N'-bis-[4-(phenyl-m-tolyl-amino)-phenyl]-biphenyl-4,4'-diamine), m-MTDATA(4,4',4"-tris (3-methylphenylphenylamino)triphenylamine), TDATA (4,4'4"-Tris(N,N-diphenylamino)triphenylamine), 2T-NATA (4,4',4"-tris{N,-(2-naphthyl)-N-phenylamino}-triphenylamine), PEDOT/PSS (Poly(3,4-ethylenedioxythiophene)/Poly(4-styrenesulfonate)), Pani/DBSA (Polyaniline/Dodecylbenzenesulfonic acid), Pani/CSA (Polyaniline/Camphor sulfonicacid), and/or PANI/PSS (Polyaniline)/Poly (4-styrenesulfonate), but is not limited thereto. Also, the HIL 40 may be formed by various suitable methods such as the vacuum evaporation method, the spin coating method, the casting method, or the Langmuir-Blodgett (LB) method.

A hole transport layer (HTL) 42 may be formed on a partial region of the HIL 40 (e.g., a partial region of the HIL located outside of the opening H) and the opening H, and includes a bank region L in which an emissive layer (EML) 50 is formed. Hydrophobic processing (treatment) may be performed for a surface of the HTL 42 so as to prevent a light-emitting material from overflowing when forming the EML 50. The bank region L of the HTL 42 acts as a pixel bank that defines a region in which a light-emitting material forming the EML 50 is printed in structure.

The HTL 42 may be formed of a triphenylamine-based material (such as N-phenylcarbazole), a carbazole-based material (such as polyvinylcarbazole), TPD (N,N'-bis(3-methylphenyl)-N,N'-diphenyl-[1,1-biphenyl]-4,4'-diamine), NPB (N,N'-di(1-naphthyl)-N,N'-diphenylbenzidine), and/or TCTA (4,4',4"-tris(N-carbazolyl)triphenylamine), but is not limited thereto.

Moreover, the HTL 42 may be formed by various suitable methods such as the vacuum evaporation method, the spin coating method, the casting method, or the LB method.

The EML 50 may be formed in the bank region L of the HTL 42, and may be formed by a printing method. Examples of the printing method may include various suitable methods such as the inkjet printing method, the nozzle printing method, the gravure printing method, the screen printing method, the spray printing method, or the electrostatic spray printing method.

The EML 50 may be formed to include a host material and a dopant material.

The host material may use (utilize), for example, Alq3 (tris(8-hydroxy-quinolatealuminium), CBP (4,4'-bis(N-carbazolyl)-1,1'-biphenyl), PVK (poly(n-vinylcabazole)), AND (9,10-di(naphthalene-2-yl)anthracene), TCTA (4,4',4"-Tris(carbazol-9-yl)-triphenylamine), TPBI (1,3,5-tris(N-phenyl-benzimidazole-2-yl)benzene), TBADN (3-tert-butyl-9,10-di(naphth-2-yl)anthracene), DSA (distyrylarylene), E3, and/or CDBP (4,4'-bis(9-carbazolyl)-2,2'-dimethyl-biphenyl), but is not limited thereto.

The dopant material may use, for example, PtOEP (Pt(II) octaethylporphine), Ir(piq)3 (tris(2-phenylisoquinoline)iridium), Btp2Ir(acac)(bis(2-(2'-benzothienyl)-pyridinato-N,C3')iridium(acetylacetonate)), Ir(ppy)3(tris(2-phenylpyridine)iridium), Ir(ppy)2(acac)(Bis(2-phenylpyridine)(Acetylacetonato)iridium(III)), Ir(mppy)3(tris(2-(4-tolyl)phenylpiridine)iridium), C545T (10-(2-benzothiazolyl)-1,1,7,7-tetramethyl-2,3,6,7-tetrahydro-1H,5H,11H-[1]benzopyrano[6,7,8-ij]-quinolizin-11-one), F2Irpic (Bis[3,5-difluoro-2-(2-pyridyl)phenyl](picolinato)iridium(III)), (F2ppy)2Ir(tmd), Ir(dfppz)3, DPVBi (4,4'-bis(2,2'-diphenylethen-1-yl)biphenyl), DPAVBi (4,4'-Bis[4-(diphenylamino)styryl]biphenyl), and/or TBPe (2,5,8,11-tetra-tert-butyl perylene), but is not limited thereto.

When the EML 50 is formed by the printing method in a comparable process, a thickness near both edges of the EML 50 may be non-uniformly formed in a process of drying the liquid organic material. This causes non-uniform emission of light, and thus, a pixel appears to have a ring-shaped belt (coffee ring effect). For this reason, the quality of the organic light-emitting device is degraded.

According to the present embodiment, the first conductive film 34 is formed to cover the first pixel electrode 32, and the second conductive pattern 36 and the insulating layer 38 are formed in order to expose a portion of the top of the first conductive film 34. The second conductive pattern 36 and the insulating layer 38, which include the opening H which exposes a portion of the top of the first conductive film 34, act as pixel defining layers, and a plurality of such pixel defining layers 36 and 38 having a thickness of tens of nanometers (nm) may be formed. Since the pixel defining layers 36 and 38 are formed to a thin thickness, the amount of light-emitting material solution which is printed on the HTL 42 and dried is reduced or minimized, thus preventing a phenomenon in which a pixel appears to have a ring-shaped belt. Accordingly, the pixel quality and the emission quality of the organic light-emitting device 1 are enhanced.

An electron transport layer (ETL) 52 and an electron injection layer (EIL) 54 may be additionally formed on the EML 50.

The EIL may be formed of a material such as LiF, NaCl, CsF, Li$_2$O, BaO, Liq, or the like.

The ETL may be formed of Alq3, BCP (2,9-Dimethyl-4,7-diphenyl-1,10-phenanthroline), Bphen (4,7-Diphenyl-1,10-phenanthroline), TAZ (3-(4-Biphenylyl)-4-phenyl-5-tert-butylphenyl-1,2,4-triazole), NTAZ (4-(Naphthalen-1-yl)-3,5-diphenyl-4H-1,2,4-triazole), tBu-PBD (2-(4-Biphenylyl)-5-(4-tert-butylphenyl)-1,3,4-oxadiazole), BAlq (Bis(2-methyl-8-quinolinolato-N1,O8)-(1,1'-Biphenyl-4-olato) aluminum), Bebq2 (beryllium bis(benzoquinolin-10-olate), and/or AND (9,10-di(naphthalene-2-yl)anthrascene), but is not limited thereto.

The encapsulation unit 60 is formed on the emission unit 30.

The encapsulating unit 60 may be formed of one or more inorganic layers and one or more organic layers which are alternately disposed. Alternatively, the encapsulating unit 60 may be formed of one or more inorganic layers.

The inorganic layer may be formed of, for example, silicon oxide, silicon nitride, silicon oxynitride, aluminum oxide, aluminum nitride, aluminum oxynitride, titanium oxide, titanium nitride, titanium oxide, tantalum oxide, tantalum nitride, hafnium oxide, hafnium nitride, zirconium oxide, zirconium nitride, cerium oxide, cerium nitride, tin oxide, tin nitride, and/or magnesium oxide. The inorganic layer is thin but has a high density, and thus has a barrier characteristic to oxygen and hydrogen.

The organic layer may be formed of acrylic-based resin, methacrylic-based resin, isoprene-based resin, vinyl-based resin, epoxy-based resin, urethane-based resin, cellulose-based resin, perylene-based resin, imide-based resin, or a compound of two or more of these. The desired (optimal) thickness of the organic layer may be determined according to a characteristic of the inorganic layer, a productivity, and a device characteristic. The organic layer mitigates a stress of the inorganic layer, and performs a planarization function.

The encapsulation unit 60 may be formed by a process such as sputtering, thermal evaporation, chemical vapor deposition (CVD), plasma enhanced chemical vapor deposition (PECVD), Ion beam assisted deposition (IBAD), or atomic layer deposition (ALD).

FIGS. 2 to 11 are schematic cross-sectional views sequentially illustrating a method of manufacturing an organic light-emitting device according to an embodiment of the present invention.

Figure 2:
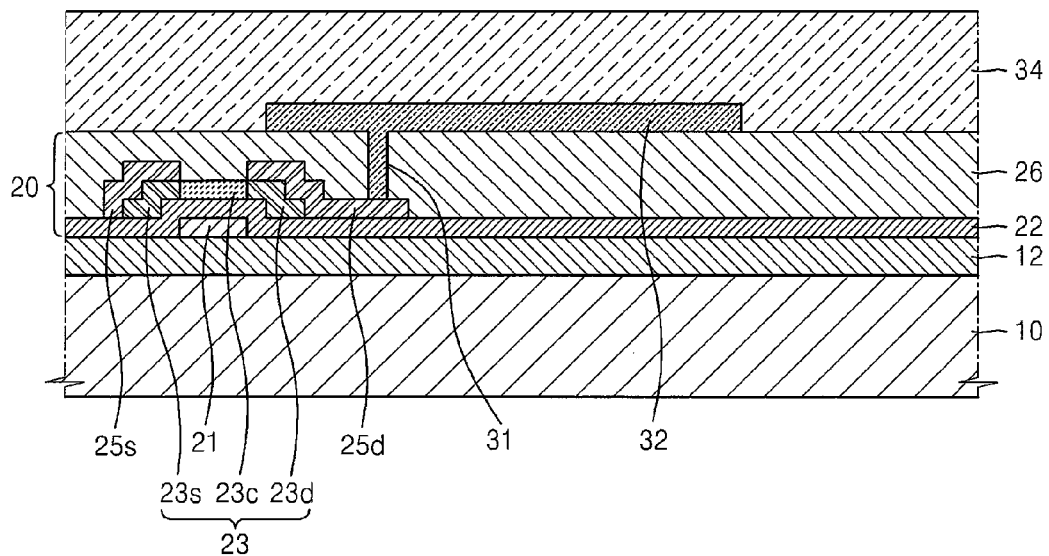
FIGS. 2 to 11 are schematic cross-sectional views sequentially illustrating a method of manufacturing an organic light-emitting device according to an embodiment of the present invention.

Referring to FIG. 2, the buffer layer 12 is formed on the substrate 10, and the driving TFT unit 20 is formed on the buffer layer 12. In the present embodiment, as an example of a TFT, a case in which the organic light-emitting device 1 includes a bottom-gate TFT is illustrated. However, the organic light-emitting device 1 may include a TFT having another kind such as a top gate TFT.

The substrate 10 may be a transparent glass substrate, or may use a substrate of various suitable materials such as a plastic substrate, a metal substrate, or the like.

The driving TFT N1 may include the gate electrode 21, the active layer 23, the source electrode 25*s*, and the drain electrode 25*d*.

The planarization layer 26 may be formed to cover the driving TFT N1. The planarization layer 26 may be formed in various suitable structures, and for example, the planarization layer 26 may be formed of an organic material, such as benzocyclobutene (BCB) or acrylics, or an inorganic material such as SiNx.

The first pixel electrode 32 that is one electrode of the organic light-emitting device 1 is formed on the planarization layer 26, and is electrically connected to the drain electrode 25*d* through the contact hole 31.

The first pixel electrode 32 may be formed as a transparent electrode or a reflective electrode. When the first pixel electrode 32 is formed as the transparent electrode, the first pixel electrode 32 may be formed of indium tin oxide (ITO), indium zinc oxide (IZO), zinc oxide (ZnO), and/or indium oxide ($In_2O_3$). When the first pixel electrode 32 is formed as the reflective electrode, the first pixel electrode 32 may include a reflective layer, which is formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent layer formed of ITO, IZO, ZnO, and/or $In_2O_3$.

Subsequently, the first conductive film 34 is formed on the planarization layer 26 to cover the first pixel electrode 32.

The first conductive film 34 may be formed of a conductive material. The conductive material may have a thickness of about 100 nm or less. For example, the conductive material may be a phthalocyanine compound (such as copper phthalocyanine), DNTPD (N,N'-diphenyl-N,N'-bis-[4-(phenyl-m-tolyl-amino)-phenyl]-biphenyl-4,4'-diamine), m-MTDATA (4,4',4"-tris (3-methylphenylphenylamino)triphenylamine), TDATA (4,4'4"-Tris(N,N-diphenylamino)triphenylamine), 2T-NATA (4,4',4"-tris{N,-(2-naphthyl)-N-phenylamino}-triphenylamine), PEDOT/PSS (Poly(3,4-ethylenedioxythiophene)/Poly(4-styrenesulfonate)), Pani/DBSA (Polyaniline/Dodecylbenzenesulfonic acid), Pani/CSA (Polyaniline/Camphor sulfonicacid), and/or PANI/PSS (Polyaniline)/Poly(4-styrenesulfonate). However, the technical spirit of the present embodiment is not limited thereto. Also, the first conductive film 34 may be formed by the vacuum evaporation method, the spin coating method, the inkjet printing method, the screen printing method, the spray printing method, and/or the heat transfer method. However, the technical spirit of the present embodiment is not limited thereto. Also, a conductivity of the first conductive film 34 may be, for example, about $10^{-5}$ to about $10^{-3}$ S/cm. A work function of the first conductive film 34 may be, for example, about 5.0 to about 5.7 eV. The first conductive film 34 electrically connects the first pixel electrode 32 to the HIL (40 of FIG. 7) formed on the first pixel electrode 32. Although not shown, the first conductive film 34 may be patterned for preventing short circuit between the first conductive film 34 and a first pixel electrode of each of the pixels other than the first pixel electrode 32 of the corresponding pixel.

Figure 3:
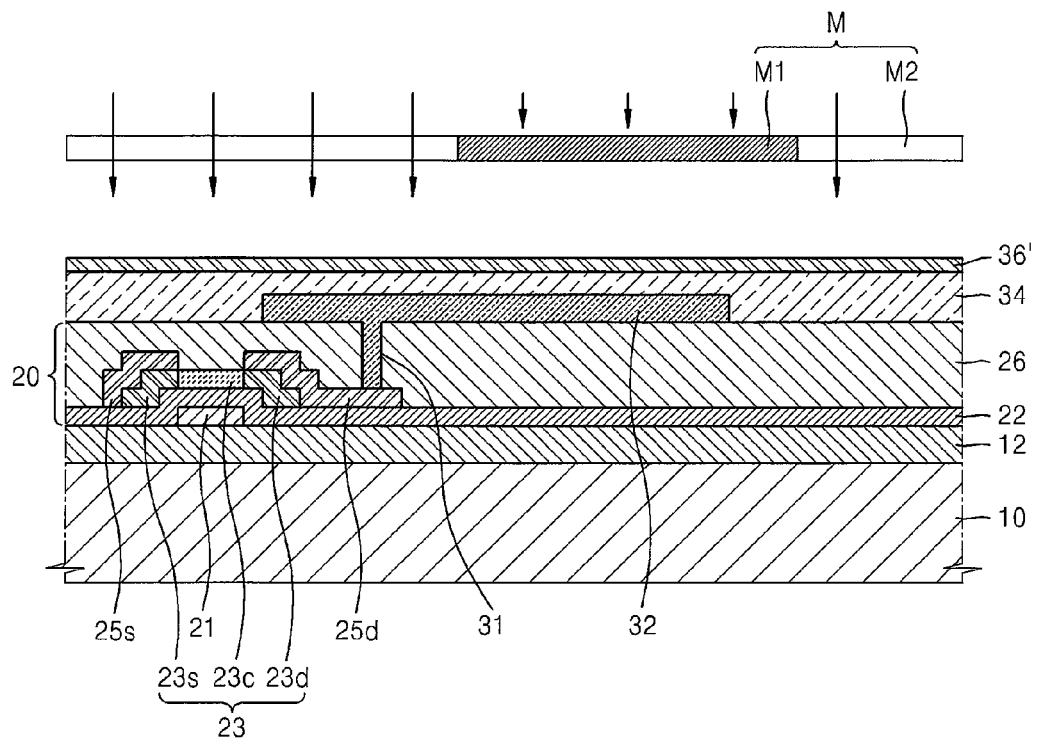
Figure 4:
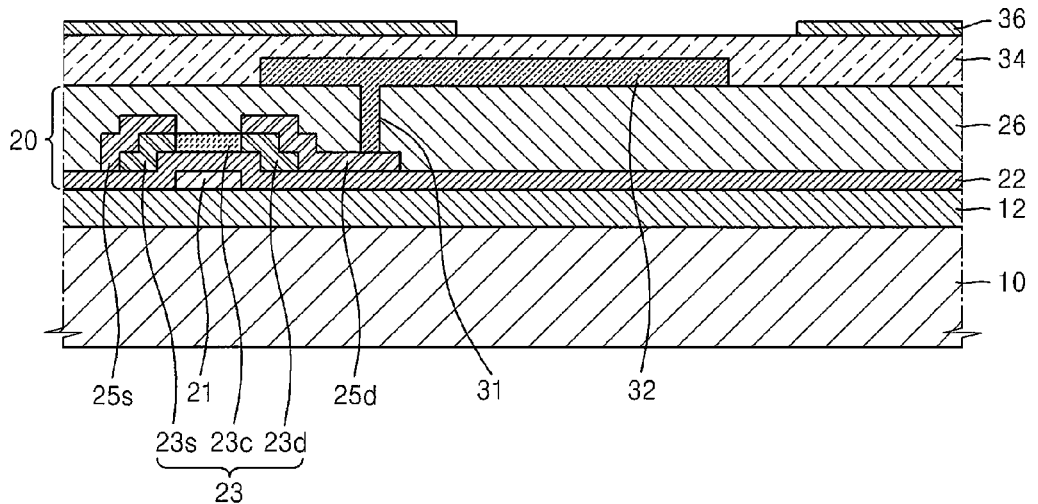

Referring to FIGS. 3 and 4, a second conductive material 36' is coated on the first conductive film 34. A thickness of the second conductive material 36' may be about 1 to about 10 nm. Also, the second conductive material 36' may be formed by the vacuum evaporation method, the spin coating method, the inkjet printing method, the screen printing method, the spray printing method, and/or the heat transfer method. However, the technical spirit of the present embodiment is not limited thereto.

Subsequently, by using (utilizing) a mask M including a blocking unit M1 and a transmitting unit M2, the second conductive pattern 36 is formed in order for a portion of the top of the first conductive film 34 to be exposed.

The second conductive material 36' is exposed through the mask M by an exposure apparatus, developed, and etched, thereby forming the second conductive pattern 36. However, a method of forming the second conductive pattern 36 is not limited to the method using the mask M.

Figure 5:
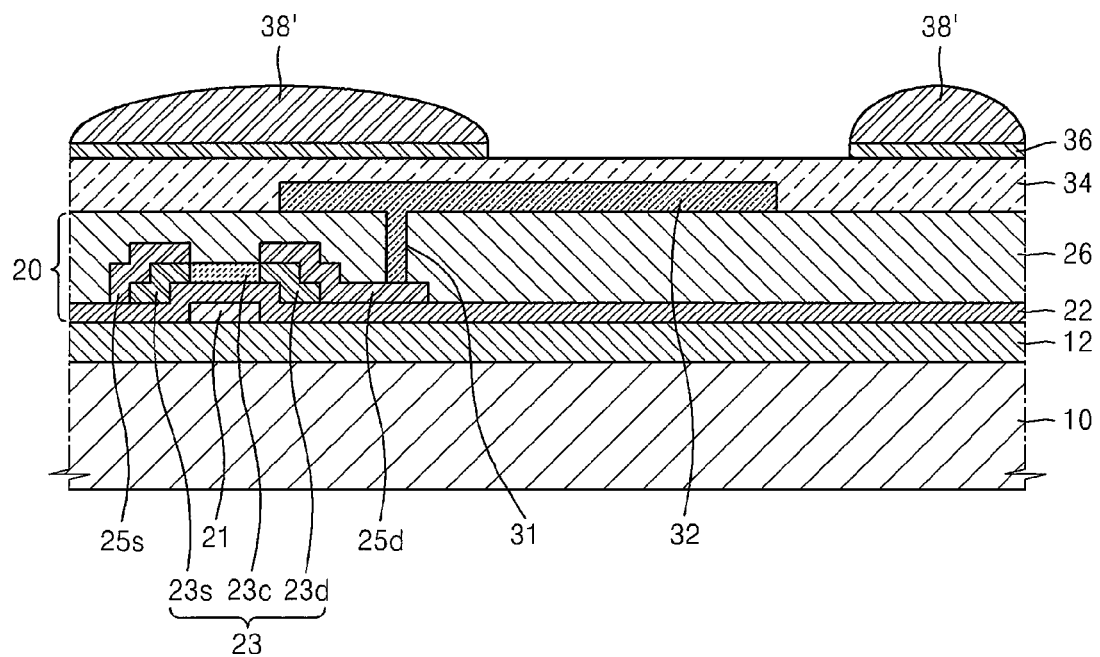
Figure 6:
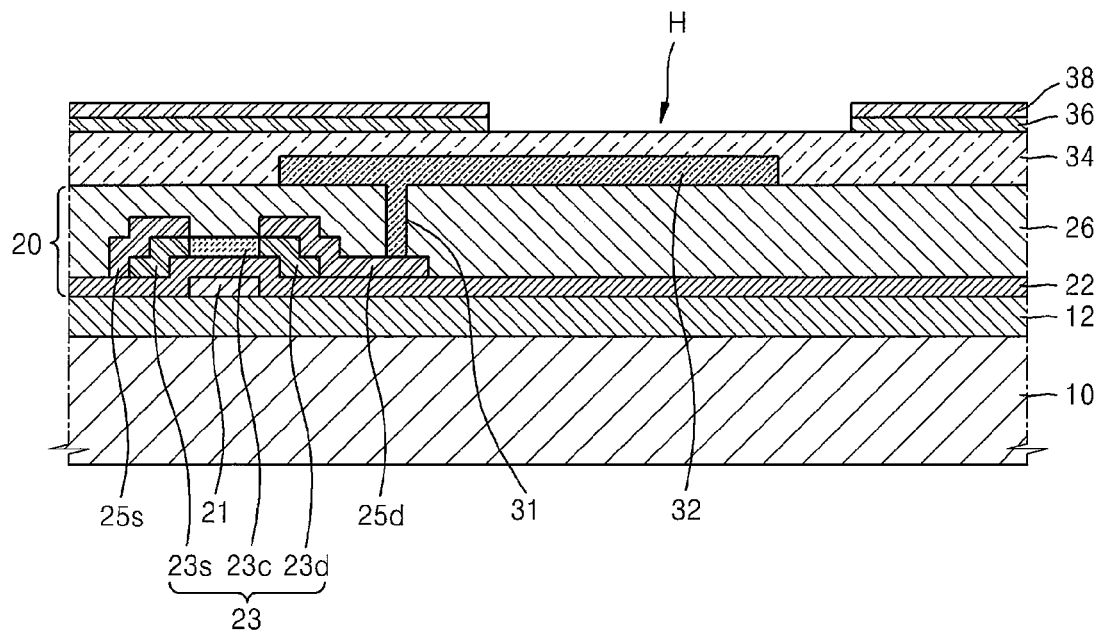

Referring to FIGS. 5 and 6, an insulating material 38' is formed on the second conductive pattern 36; and by drying the insulating material 38', the insulating layer 38 is formed on the second conductive pattern 36. A thickness of the insulating material 38' may be about 10 to about 90 nm. The insulating layer 38 may be formed of an insulating material such as silicon oxide or silicon nitride, or may be formed of an insulating organic material. Also, the insulating material 38' may be formed by the gravure coating method, the slit coating method, the bar coating method, the spray coating method, the vacuum filtration method, the spin coating method, the electrophoretic deposition method, the casting method, the inkjet printing method, and/or the offset printing method. However, the technical spirit of the present embodiment is not limited thereto.

The second conductive pattern 36 and the insulating layer 38 include the opening H to expose a portion of the top of the first conductive film 34, and act as pixel defining layers.

Figure 7:
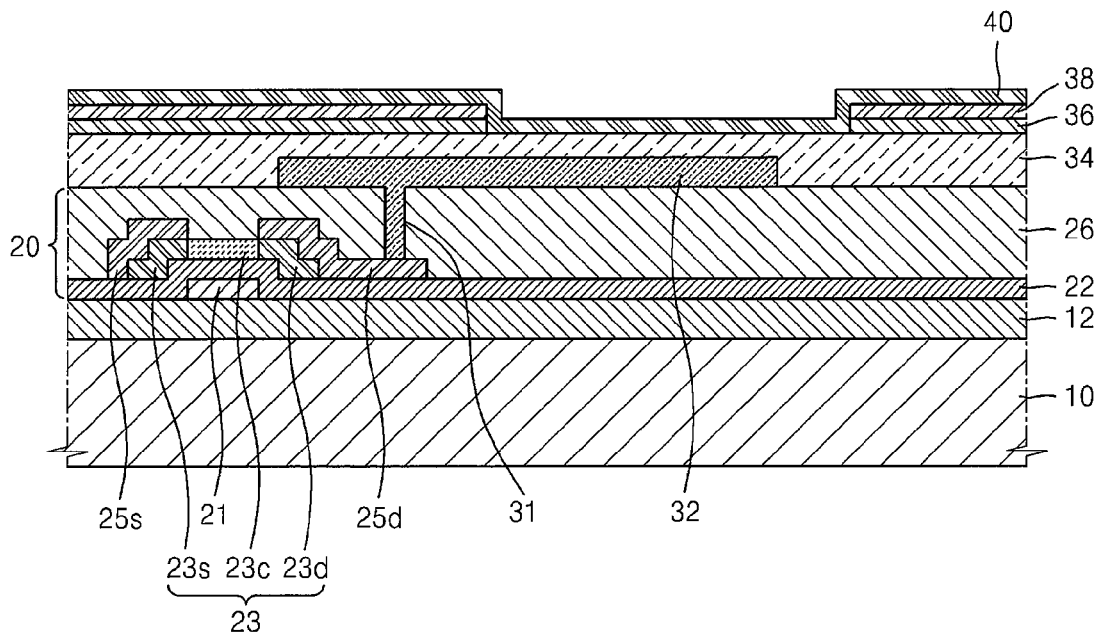

Referring to FIG. 7, the HIL 40 is formed on the insulating layer 38 and the first conductive film 34 to cover the exposed top of the first conductive film 34.

The HIL 40 may be formed of a phthalocyanine compound (such as copper phthalocyanine), DNTPD (N,N'-diphenyl-N,N'-bis-[4-(phenyl-m-tolyl-amino)-phenyl]-biphenyl-4,4'-diamine), m-MTDATA(4,4',4"-tris (3-methylphenylphenylamino)triphenylamine), TDATA (4,4'4"-Tris(N,N-diphenylamino)triphenylamine), 2T-NATA (4,4',4"-tris{N,-(2-naphthyl)-N-phenylamino}-triphenylamine), PEDOT/PSS (Poly(3,4-ethylenedioxythiophene)/Poly(4-styrenesulfonate)), Pani/DBSA (Polyaniline/Dodecylbenzenesulfonic acid), Pani/CSA (Polyaniline/Camphor sulfonicacid), and/or PANI/PSS (Polyaniline)/Poly (4-styrenesulfonate), but is not limited thereto. Also, the HIL 40 may be formed by various suitable methods such as the vacuum evaporation method, the spin coating method, the casting method, or the LB method.

Figure 8:
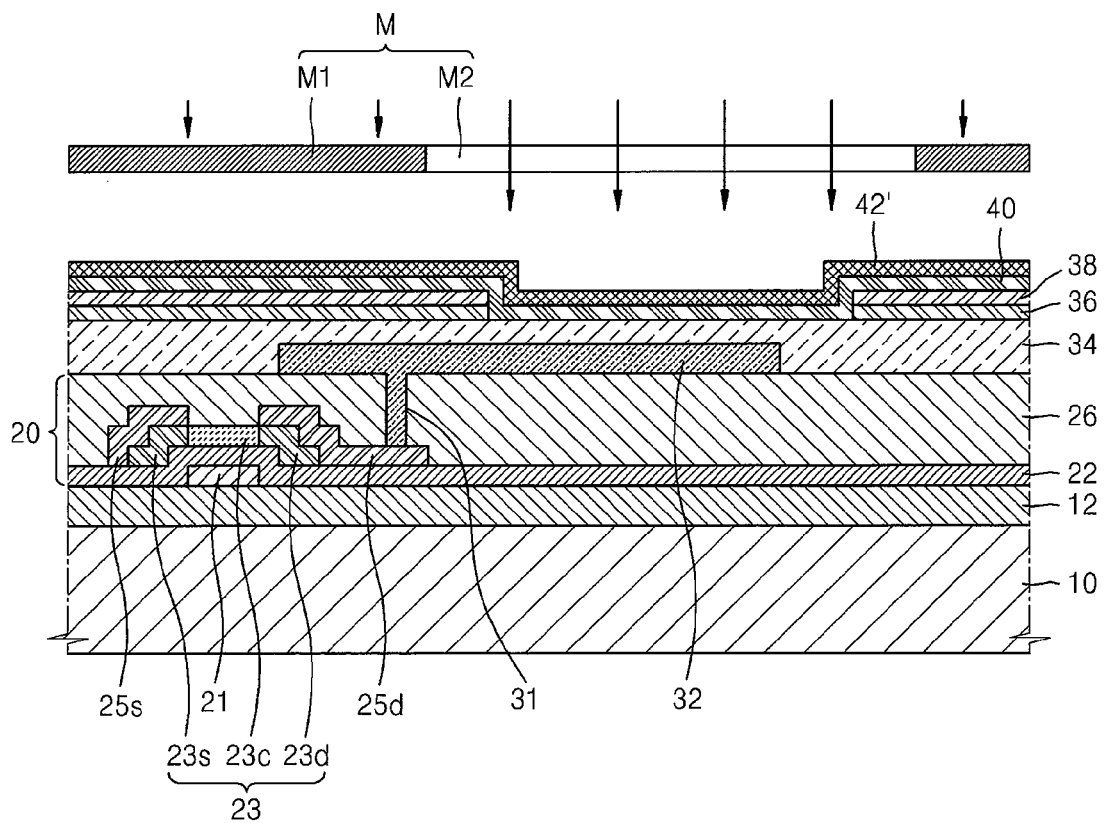
Figure 9:
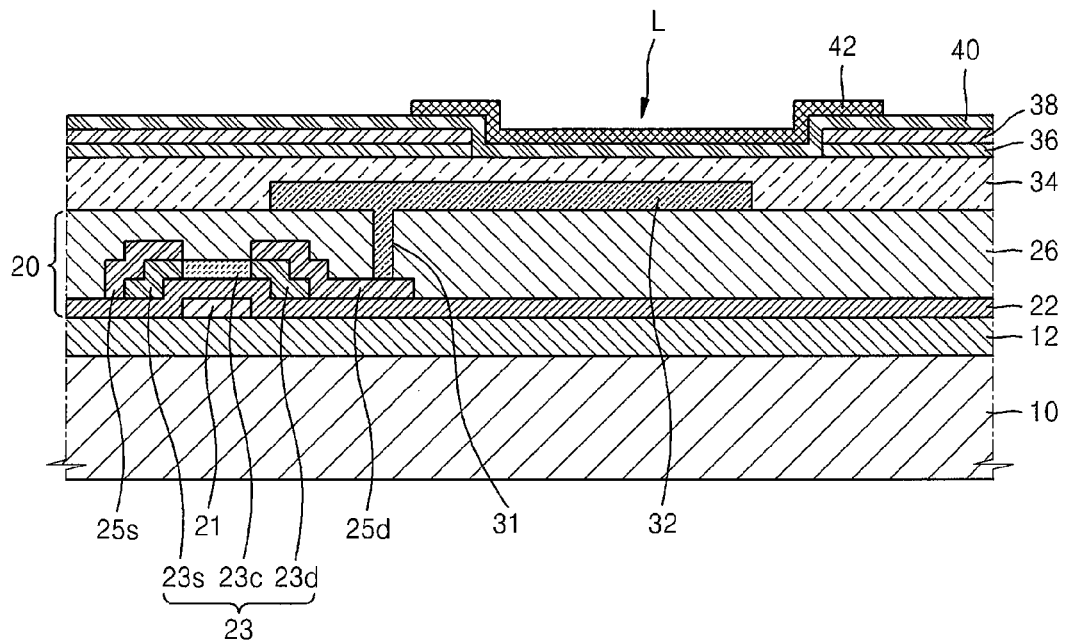

Referring to FIGS. 8 and 9, a hole transport material 42' is formed on the HIL 40.

The hole transport material 42' may be a triphenylamine-based material (such as N-phenylcarbazole), a carbazole-based material (such as polyvinylcarbazole), TPD (N,N'-bis (3-methylphenyl)-N,N'-diphenyl-[1,1-biphenyl]-4,4'-diamine), NPB (N,N'-di(1-naphthyl)-N,N'-diphenylbenzidine), and/or TCTA (4,4',4"-tris(N-carbazolyl) triphenylamine), but is not limited thereto.

The hole transport material 42' may be formed by the vacuum evaporation method, the spin coating method, the inkjet printing method, the screen printing method, the spray printing method, and/or the heat transfer method. However, the technical spirit of the present embodiment is not limited thereto.

Subsequently, the HTL 42 is formed by using (utilizing) the mask M including the blocking unit M1 and the transmitting unit M2.

The HTL 42 includes the bank region L, and in a subsequent process, the HTL 42 acts as a pixel bank in which a light-emitting material (50' of FIG. 10) is printed. Also, hydrophobic processing may be performed for the surface of the HTL 42 so as to prevent the light-emitting material (50' of FIG. 10) from overflowing when printing the light-emitting material.

Figure 10:
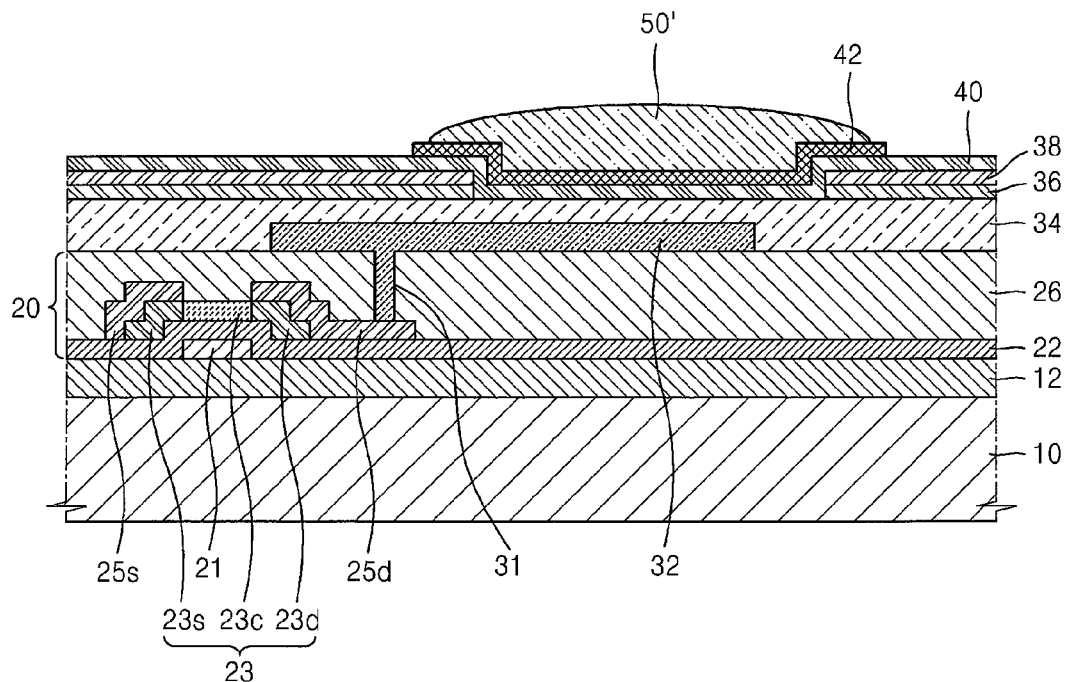

Referring to FIG. 10, the light-emitting material 50' is formed on the bank region L limited (defined) by the HTL 42.

The light-emitting material 50' may be formed on the HTL 42 by various suitable methods such as the inkjet printing method, the nozzle printing method, the gravure printing method, the screen printing method, the spray printing method, or the electrostatic spray printing method.

The light-emitting material 50' may be formed to include a host material and a dopant material.

The host material may use, for example, Alq3 (tris(8-hydroxy-quinolatealuminium), CBP (4,4'-bis(N-carbazolyl)-1,1'-biphenyl), PVK (poly(n-vinylcabazole)), AND (9,10-di (naphthalene-2-yl)anthracene), TCTA (4,4',4"-Tris (carbazol-9-yl)-triphenylamine), TPBI (1,3,5-tris(N-phenylbenzimidazole-2-yl)benzene), TBADN (3-tert-butyl-9,10-di(naphth-2-yl) anthracene), DSA (distyrylarylene), E3, and/or CDBP (4,4'-bis(9-carbazolyl)-2,2'-dimethyl-biphenyl), but is not limited thereto.

The dopant material may use, for example, PtOEP (Pt(II) octaethylporphine), Ir(piq)3(tris(2-phenylisoquinoline)iridium), Btp2Ir (acac)(bis(2-(2'-benzothienyl)-pyridinato-N,C3')iridium(acetylacetonate)), Ir(ppy)3(tris(2-phenylpyridine)iridium), Ir(ppy)2(acac)(Bis(2-phenylpyridine)(Acetylacetonato)iridium(III)), Ir(mppy)3 (tris(2-(4-tolyl)phenylpiridine)iridium), C545T (10-(2-benzothiazolyl)-1,1,7,7-tetramethyl-2,3,6,7-tetrahydro-1H,5H,11H-[1]benzopyrano[6,7,8ij]-quinolizin-11-one), F2Irpic (Bis[3,5-difluoro-2-(2-pyridyl)phenyl](picolinato) iridium(III)), (F2ppy)2Ir(tmd), Ir(dfppz)3, DPVBi (4,4'-bis (2,2'-diphenylethen-1-yl)biphenyl), DPAVBi (4,4'-Bis[4-(diphenylamino)styryl]biphenyl), and/or TBPe (2,5,8,11-tetra-tert-butyl perylene), but is not limited thereto.

Figure 11:
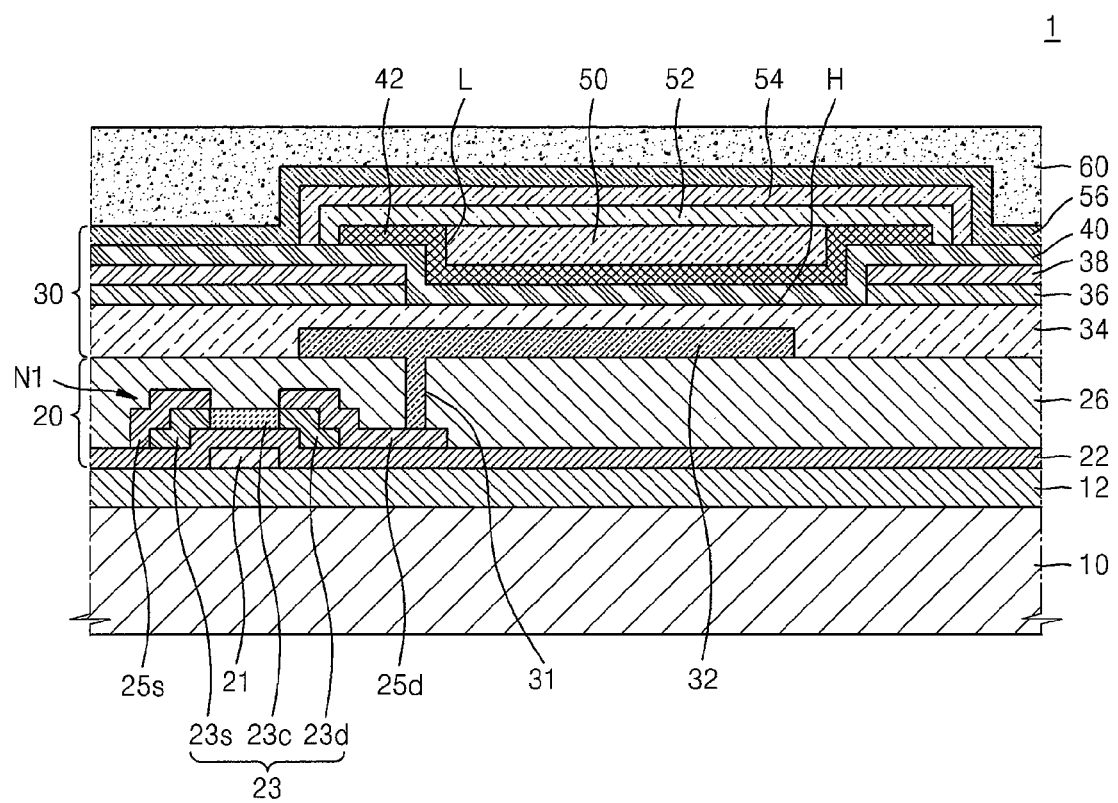

Referring to FIG. 11, the EML 50 is formed by drying the light-emitting material 50'.

Subsequently, the ETL 52 and the EIL 54 may be additionally formed on the EML 50.

Subsequently, the second pixel electrode 56 disposed opposite to the first pixel electrode 32 is formed on the EIL 54.

The second pixel electrode 56 may be formed as the transparent electrode or the reflective electrode. When the second pixel electrode 56 is formed as the transparent electrode, the second pixel electrode 56 may include an intermediate layer, which is formed by depositing Li, Ca, LiF/Ca, LiF/Al, Al, Mg, or a compound thereof so as to form the intermediate layer, and an assistant electrode or a bus electrode line (which is formed of a transparent conductive material such as ITO, IZO, ZnO, or $In_2O_3$) is formed with the intermediate layer. When the second pixel electrode 56 is formed as the reflective electrode, the second pixel electrode 56 may be formed of Li, Ca, LiF/Ca, LiF/Al, Al, Mg, or a compound thereof.

The encapsulation unit 60 is formed on the emission unit 30.

The encapsulating unit 60 may be formed of one or more inorganic layers and one or more organic layers which are alternately disposed. Alternatively, the encapsulating unit 60 may be formed of one or more inorganic layers.

The inorganic layer is thin but has a high density, and thus can be a barrier (e.g., has the barrier characteristic) to oxygen and hydrogen. Accordingly, the organic layer mitigates the stress of the inorganic layer, and performs the planarization function.

The encapsulation unit 60 may be formed by a process such as sputtering, thermal evaporation, chemical vapor deposition (CVD), plasma enhanced chemical vapor deposition (PECVD), Ion beam assisted deposition (IBAD), or atomic layer deposition (ALD).

According to the present embodiment, since the second conductive pattern 36 and the insulation layer 38 may be formed as the pixel defining layer and be formed to have a thin thickness, the EML 50 may be formed by printing a small amount of light-emitting material 50' on the bank region L of the HTL 42.

Therefore, since a small amount of light-emitting material 50' is used, a thin film uniformity of the EML 50 is prevented from being deteriorated in drying compared to when printing a large amount of light-emitting material 50', and the thin film uniformity of the EML 50 is improved, thus increasing a reliability of the organic light-emitting device.

As described above, according to the one or more of the above embodiments of the present invention, the organic light-emitting device using (utilizing) the printing method prevents light from being emitted from the edge region of the emission unit, thereby enhancing a quality of extracted light.

It should be understood that the example embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. An organic light-emitting device comprising:
a first pixel electrode on a substrate;
a first conductive film on the substrate and configured to cover the first pixel electrode;
a second conductive pattern and an insulating layer sequentially formed on the first conductive film, and the second conductive pattern and the insulating layer having an opening to expose a portion of a top of the first conductive film;
a hole injection layer on the opening and the insulating layer to cover the exposed portion of the first conductive film;
a hole transport layer formed in the opening and on a partial region of the hole injection layer; and
an emissive layer on the hole transport layer.

2. The organic light-emitting device of claim 1, wherein a conductivity of the first conductive film is about $10^{-5}$ to about $10^{-3}$ S/cm, and a work function of the first conductive film is about 5.0 to about 5.7 eV.

3. The organic light-emitting device of claim 1, wherein the hole injection layer is formed to surround an exposed side surface of the insulating layer and an exposed side surface of the second conductive pattern.

4. The organic light-emitting device of claim 1, wherein,
a thickness of the second conductive pattern is about 1 to about 10 nm, and
a thickness of the insulating layer is about 10 to about 90 nm.

5. The organic light-emitting device of claim 1, wherein the second conductive pattern and the insulating layer, each having the opening, form a pixel defining layer.

6. The organic light-emitting device of claim 1, wherein the hole transport layer comprises a bank region in which the emissive layer is formed.

7. The organic light-emitting device of claim 1, wherein the insulating layer is formed by a gravure coating method, a slit coating method, a bar coating method, a spray coating method, a vacuum filtration method, a spin coating method, an electrophoretic deposition method, a casting method, an inkjet printing method, and/or an offset printing method.

8. The organic light-emitting device of claim 1, wherein the emissive layer is formed by an inkjet printing method, a nozzle printing method, a gravure printing method, a screen printing method, a spray printing method, and/or an electrostatic spray printing method.

9. The organic light-emitting device of claim 1, further comprising:
an electron transport layer on the emissive layer; and
an electron injection layer on the electron transport layer.

10. The organic light-emitting device of claim 1, wherein the hole injection layer is formed of a phthalocyanine compound, DNTPD (N,N'-diphenyl-N,N'-bis-[4-(phenyl-m-tolyl-amino)-phenyl]-biphenyl-4,4'-diamine), m-MTDATA (4,4',4"-tris(3-methylphenylphenylamino)triphenylamine), TDATA (4,4'4"-Tris(N,N-diphenylamino)triphenylamine), 2T-NATA (4,4',4"-tris{N,-(2-naphthyl)-N-phenylamino}-triphenylamine), PEDOT/PSS (Poly(3,4-ethylenedioxythiophene)/Poly(4-styrenesulfonate)), Pani/DBSA (Polyaniline/Dodecylbenzenesulfonic acid), Pani/CSA (Polyaniline/Camphor sulfonicacid), and/or PANI/PSS (Polyaniline)/Poly(4-styrenesulfonate).

11. The organic light-emitting device of claim 1, further comprising:
a second pixel electrode on the emissive layer; and
an encapsulating unit comprising one or more inorganic layers and one or more organic layers alternately formed to cover the second pixel electrode.

12. A method of manufacturing an organic light-emitting device, the method comprising:
forming a first pixel electrode on a substrate;
forming a first conductive film to cover the first pixel electrode;
sequentially forming a second conductive pattern and an insulating layer to have an opening to expose a portion of a top of the first conductive film;
forming a hole injection layer on the opening and the insulating layer;
forming a hole transport layer in the opening and on a partial region of the hole injection layer; and
forming an emissive layer on the hole transport layer.

13. The method of claim 12, wherein the forming of the second conductive pattern comprises:
forming a second conductive material on the first conductive film; and
forming the second conductive pattern to expose the portion of the top of the first conductive film by utilizing a mask applied to the second conductive material.

14. The method of claim 12, wherein the sequentially forming of the second conductive pattern and the insulating layer comprises forming the insulating layer on the second conductive pattern by utilizing a gravure coating method, a slit coating method, a bar coating method, a spray coating method, a vacuum filtration method, a spin coating method, an electrophoretic deposition method, a casting method, an inkjet printing method, and/or an offset printing method.

15. The method of claim 12, wherein,
a thickness of the second conductive pattern is about 1 to about 10 nm, and
a thickness of the insulating layer is about 10 to about 90 nm.

16. The method of claim 12, wherein the forming of the hole injection layer comprises forming the hole injection layer to surround an exposed side surface of the insulating layer and an exposed side surface of the second conductive pattern.

17. The method of claim 12, wherein the forming of the hole transport layer comprises:
forming a hole transport material on the hole injection layer; and
forming the hole transport layer comprising a bank region in which the emissive layer is formed in the opening, by utilizing a mask applied to the hole transport material.

18. The method of claim 17, wherein the forming of the emissive layer comprises:
forming a light-emitting material in the bank region by utilizing an inkjet printing method, a nozzle printing method, a gravure printing method, a screen printing method, a spray printing method, and/or an electrostatic spray printing method; and
drying the light-emitting material to form the emissive layer.

19. The method of claim 12, wherein the forming of the emissive layer comprises:

forming an electron transport layer on the emissive layer after the forming of the emissive layer; and forming an electron injection layer on the electron transport layer.

20. The method of claim 12, further comprising: p1 forming a second pixel electrode on the emissive layer after the forming of the emissive layer; and forming an encapsulating unit to cover the second pixel electrode.

* * * * *